(12) United States Patent
Vergara et al.

(10) Patent No.: US 10,314,164 B1
(45) Date of Patent: Jun. 4, 2019

(54) CIRCUIT BOARD ASSEMBLIES AND METHODS OF ASSEMBLING CIRCUIT BOARDS AND BUS BARS

(71) Applicant: Astec International Limited, Kowloon (HK)

(72) Inventors: Edgardo Hernando Vergara, Pasig (PH); Adriane Cabral Ginez, Quezon (PH); Joel Cadiente Macadangdang, Pasig (PH)

(73) Assignee: Astec International Limited, Kwun Tong, Kowloon (HK)

( * ) Notice: Subject to any disclaimer, the term of this patent is extended or adjusted under 35 U.S.C. 154(b) by 0 days.

(21) Appl. No.: 15/851,195

(22) Filed: Dec. 21, 2017

(51) Int. Cl.
| | |
|---|---|
| *H05K 1/02* | (2006.01) |
| *H01R 12/58* | (2011.01) |
| *H01R 12/71* | (2011.01) |
| *H01R 12/70* | (2011.01) |
| *H05K 3/30* | (2006.01) |
| *H05K 3/34* | (2006.01) |

(52) U.S. Cl.
CPC ......... *H05K 1/0263* (2013.01); *H01R 12/585* (2013.01); *H01R 12/7064* (2013.01); *H01R 12/718* (2013.01); *H05K 3/301* (2013.01); *H05K 3/3447* (2013.01); *H05K 2201/1059* (2013.01); *H05K 2201/10272* (2013.01); *H05K 2201/10295* (2013.01); *H05K 2203/1581* (2013.01)

(58) Field of Classification Search
CPC .... H05K 1/0263; H05K 1/0265; H05K 3/303; H05K 3/342; H05K 3/3447; H05K 3/3494; H05K 2201/10272; H05K 2201/1059; H01R 12/585; H01R 12/7064
See application file for complete search history.

(56) References Cited

U.S. PATENT DOCUMENTS

| | | | |
|---|---|---|---|
| 5,285,352 A * | 2/1994 | Pastore | H01L 23/36 165/185 |
| 6,215,681 B1 | 4/2001 | Schuurman et al. | |
| 6,224,430 B1 * | 5/2001 | Kusuda | H01R 12/515 439/709 |
| 6,922,339 B2 | 7/2005 | Nakamura et al. | |
| 7,944,681 B2 | 5/2011 | Nakanishi et al. | |
| 2008/0017406 A1 * | 1/2008 | Espino | H01L 23/3672 174/260 |

* cited by examiner

*Primary Examiner* — Hoa C Nguyen
(74) *Attorney, Agent, or Firm* — Harness, Dickey & Pierce, P.L.C.

(57) ABSTRACT

According to some aspects of the present disclosure, circuit board assemblies are disclosed. Example circuit board assemblies include a printed circuit board having a first surface and a second surface, and defining an opening having at least one side extending from the first surface to the second surface. The assembly also includes a bus bar having a first surface, a second surface, and at least one side. The bus bar is secured in the opening of the printed circuit board via a press-fit, such that a slot is defined between the at least one side of the bus bar and the at least one side of the opening defined by the printed circuit board. The assembly further includes an electrical lead positioned in the slot, and solder disposed between the electrical lead and the bus bar to electrically couple the electrical lead and the bus bar.

25 Claims, 8 Drawing Sheets

CIRCUIT BOARD ASSEMBLIES AND METHODS OF ASSEMBLING CIRCUIT BOARDS AND BUS BARS

FIELD

The present disclosure relates to circuit board assemblies and methods of assembling circuit boards and bus bars.

BACKGROUND

This section provides background information related to the present disclosure which is not necessarily prior art.

Bus bars are often disposed on surfaces of printed circuit boards to conduct current between electrical components disposed on the printed circuit board. Separately, some electrical components have thru-hole electrical leads adapted for insertion through an opening defined by the printed circuit board. Solder is commonly used to create electrical connections between bus bars and electrical components, etc.

SUMMARY

This section provides a general summary of the disclosure, and is not a comprehensive disclosure of its full scope or all of its features.

According to one aspect of the present disclosure, a circuit board assembly includes a printed circuit board having a first surface and a second surface opposite the first surface. The printed circuit board defines an opening having at least one side extending from the first surface of the printed circuit board to the second surface of the printed circuit board. The assembly also includes a bus bar having a first surface, a second surface opposite the first surface, and at least one side extending from the first surface of the bus bar to the second surface of the bus bar. The bus bar is secured in the opening of the printed circuit board via a press-fit, such that a slot is defined between the at least one side of the bus bar and the at least one side of the opening defined by the printed circuit board. The assembly further includes an electrical lead positioned in the slot defined between the at least one side of the bus bar and the at least one side of the opening defined by the printed circuit board, and solder disposed between the electrical lead and the bus bar to electrically couple the electrical lead and the bus bar.

According to another aspect of the present disclosure, a method of assembling a printed circuit board and a bus bar is disclosed. The printed circuit board includes a first surface and a second surface opposite the first surface, and defines an opening having at least one side extending from the first surface of the printed circuit board to the second surface of the printed circuit board. The method comprises press-fitting a bus bar into the opening defined by a printed circuit board to secure the bus bar in the opening of the printed circuit board, such that a slot is defined between at least one side of the bus bar and at least one side of the opening defined by the printed circuit board. The method also includes positioning an electrical lead in the slot defined between the at least one side of the bus bar and the at least one side of the opening defined by the printed circuit board, and soldering the electrical lead to the bus bar to electrically couple the electrical lead to the bus bar.

Further aspects and areas of applicability will become apparent from the description provided herein. It should be understood that various aspects and features of this disclosure may be implemented individually or in combination with one or more other aspects or features. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding features throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
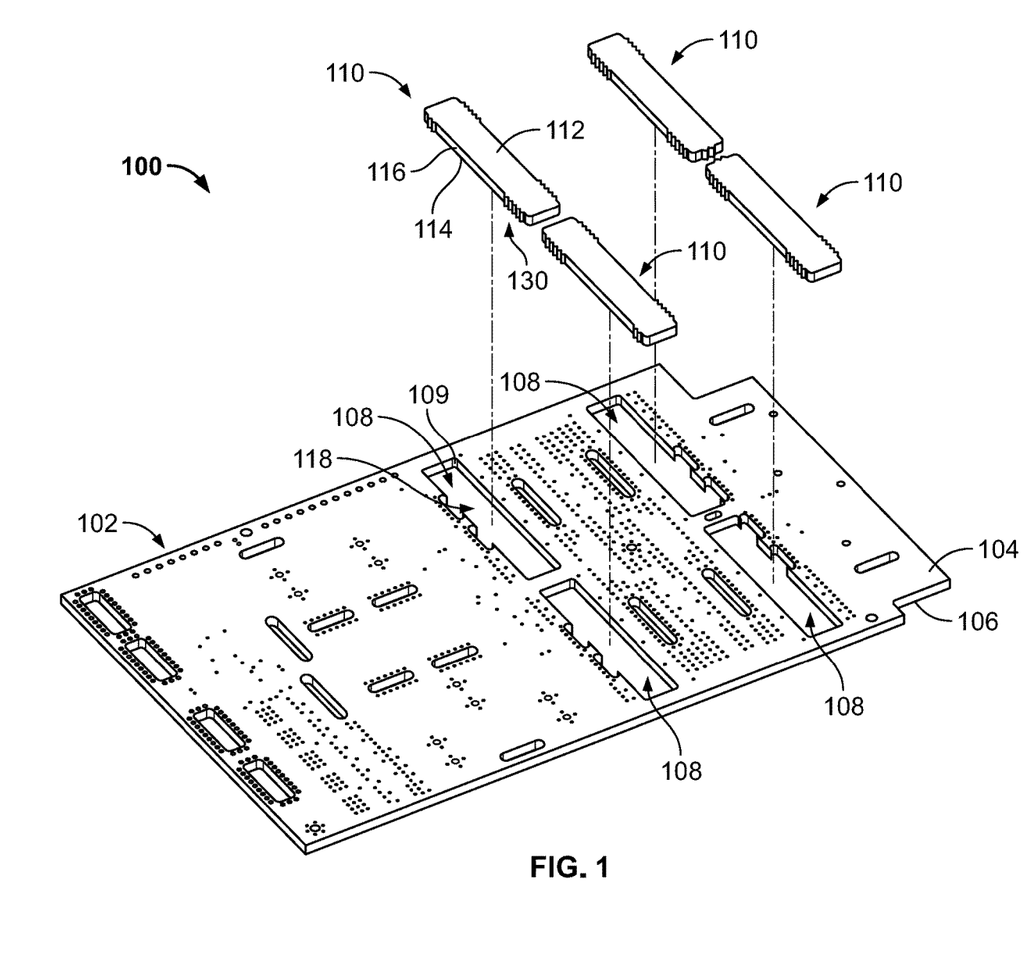
FIG. 1 is an exploded perspective view of a circuit board assembly according to one example embodiment of the present disclosure.

A circuit board assembly according to one example embodiment of the present disclosure is illustrated in FIGS. 1-4, and indicated generally by reference number 100. As shown in FIG. 1, the circuit board assembly 100 includes a printed circuit board 102 having a first surface 104 and a second surface 106 opposite the first surface 104. The printed circuit board 102 defines an opening 108 having a side 109 extending from the first surface 104 of the printed circuit board 102 to the second surface 106 of the printed circuit board 102.

The assembly 100 also includes a bus bar 110 having a first surface 112, a second surface 114 opposite the first surface 112, and at least one side 116 extending from the first surface 112 of the bus bar 110 to the second surface 114 of the bus bar 110.

Figure 2:
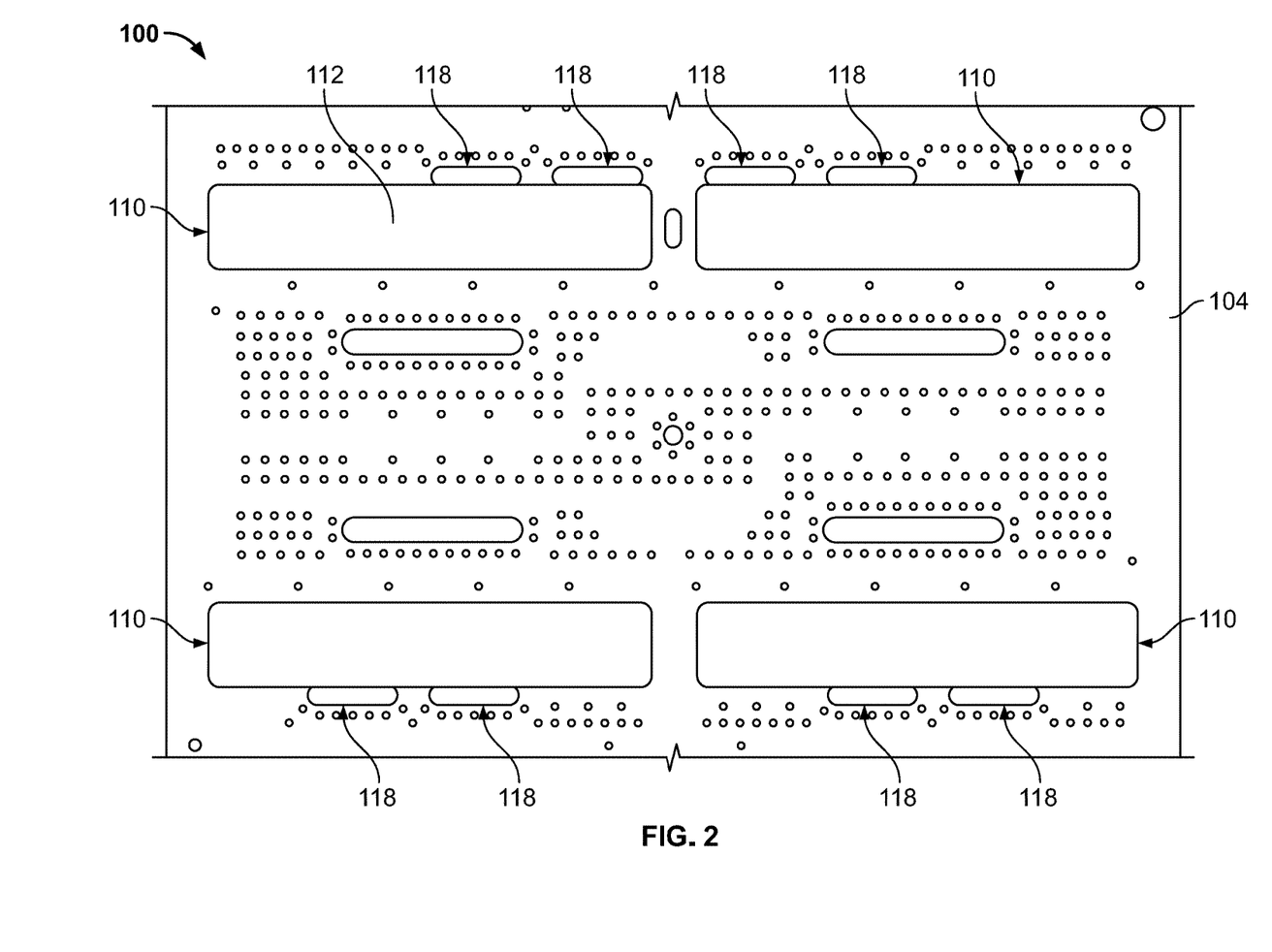
FIG. 2 is a bottom view of the circuit board assembly of FIG. 1, with the bus bars press-fit in the printed circuit board.

As shown in FIG. 2, the bus bar 110 is secured in the opening 108 of the printed circuit board 102 via a press-fit. A slot 118 is defined between the side 116 of the bus bar and a side 109 of the opening 108 defined by the printed circuit board 102.

Figure 3:
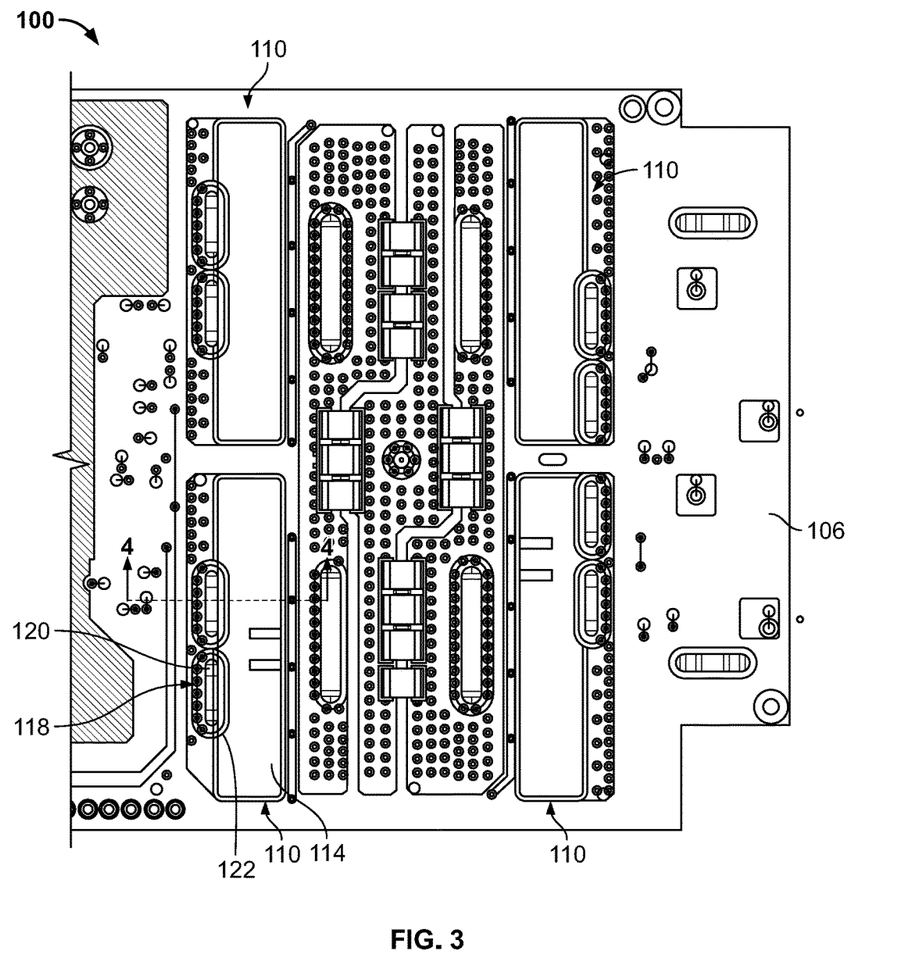
FIG. 3 is a bottom view of the circuit board assembly of FIG. 1, including an electrical lead soldered to the bus bar.

Referring now to FIG. 3, the assembly 100 includes an electrical lead 120. The electrical lead 120 is positioned in the slot 118 defined between the side 116 of the bus bar 110 and the side 109 of the opening 108 defined by the printed circuit board 102.

Solder 122 is disposed between the electrical lead 120 and the bus bar 110 to electrically couple the electrical lead 120 and the bus bar 110. In some embodiments, the electrical lead 120 may include a thru-hole bus bar, and the bus bar 110 may be a surface mount bus bar.

The bus bar 110 can be press-fit into the opening 108 of the printed circuit board 102 using any suitable press-fit approach. For example, the bus bar 110 can be press-fit into the opening 108 defined by the printed circuit board 102 using a hand press, fixtures made of aluminum and/or steel, etc. During the press-fit process a large amount of friction may be generated between teeth of the bus bar 110 and the printed circuit board 102, but the printed circuit board 110 is typically not damaged during the press-fit process.

Press-fitting the bus bar 110 into the opening 108 of the printed circuit board 102 secures (e.g., retains, mechanically couples, etc.) the bus bar 110 in the printed circuit board 102. In some embodiments, the assembly 100 may not include any adhesives coupling the bus bar 110 to the printed circuit board 102.

Figure 4:
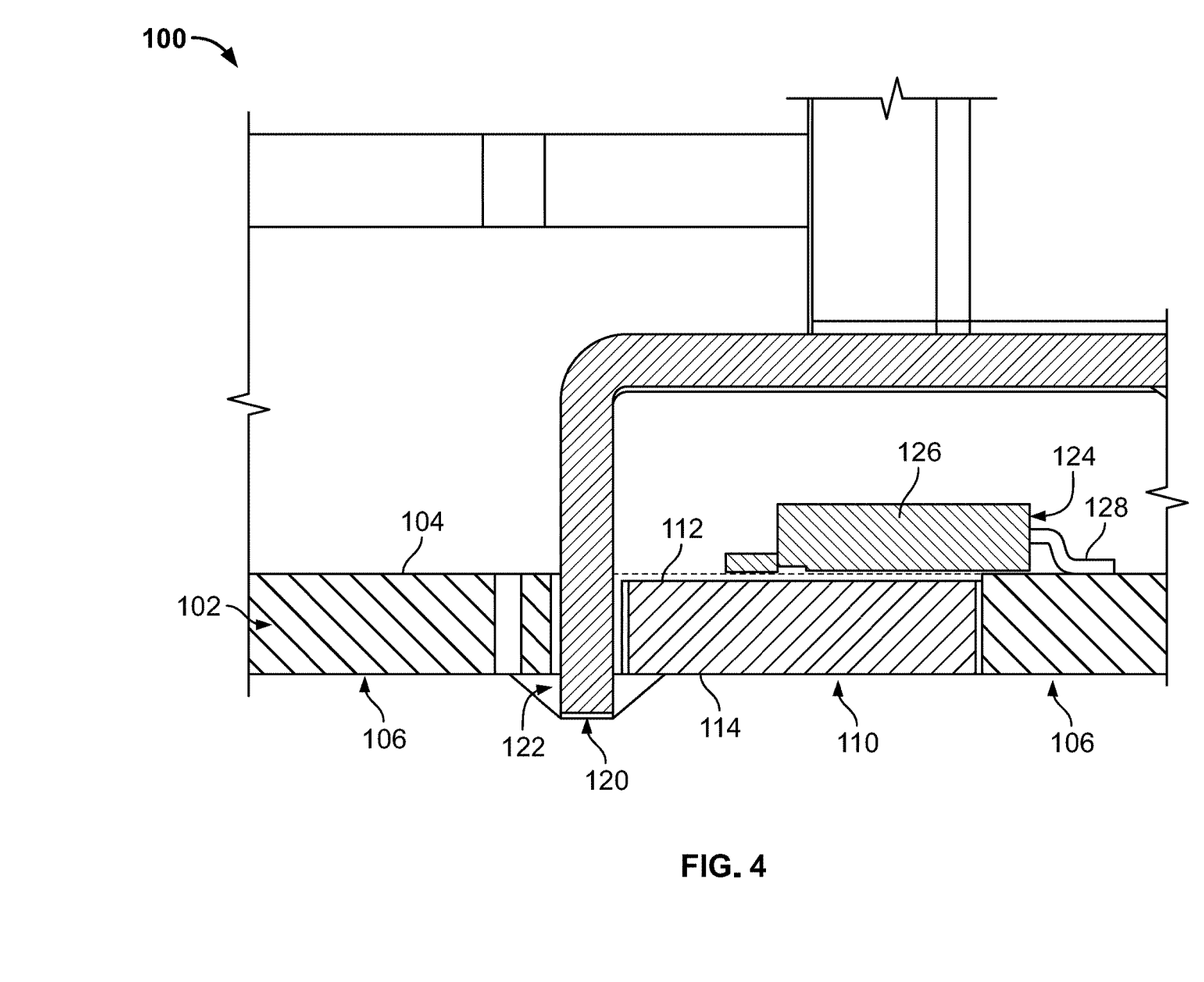
FIG. 4 is a section view taken along line 4-4 in FIG. 3.

As shown in FIG. 4, the bus bar 110 may be press fit into the opening 108 of the printed circuit board 102 such that the first surface 112 of the bus bar 110 is substantially coplanar with the first surface 104 of the printed circuit board 102, and the second surface 114 of the bus bar 110 is substantially coplanar with the second surface 106 of the printed circuit board. This may facilitate even placement of an electrical component 124, even application of the solder 122, etc.

The electrical lead 120 extends beyond the second surface 114 of the bus bar 110, and beyond the second surface 106 of the printed circuit board 102. This allows the electrical lead 120 to be wave soldered to the bus bar 110. For example, the printed circuit board 102 can be passed over molten solder (e.g., in a pan, etc.), and a pump can produce an upwelling of the molten solder to generate a standing wave. As the printed circuit board 102 makes contact with this wave, the electrical lead 120 is soldered to the bus bar 110.

The electrically conductive solder 122 directly connects the press-fit bus bar 110 with the electrical lead 120. This improves electrical efficiency between the bus bar 110 and the electrical lead 120, and reduces (e.g., minimizes) interconnection losses.

In some embodiments, one or more electrical components may be electrically coupled to the printed circuit board 102, with the bus bar 110 electrically coupled between the electrical lead 120 and the one or more electrical components. Therefore, the bus bar 110 can conduct current between the electrical lead 120 and the one or more electrical components.

As shown in FIG. 4, an electrical component 124 is positioned on the first surface 112 of the bus bar 110. Because the electrical lead 120 is soldered to the second surface 114 of the bus bar 110, the electrical lead 120 and electrical component 124 are coupled to opposite sides of the bus bar 110.

The electrical component 124 is in thermal contact with the bus bar 110 to dissipate heat from the electrical component 124 to the bus bar 110. For example, the electrical component 124 may include any suitable electrical component (e.g., electronic component, device, etc.) that generates heat during operation. Placing the electrical component 124 in thermal contact with the bus bar 110 allows the bus bar 110 to dissipate the heat generated by the electrical component 124 while the electrical component 124 is operating. The electrical component 124 may be soldered to the bus bar 110, to allow heat transfer from the electrical component 124 to the bus bar 110 via the solder.

In some embodiments, the electrical component 124 can include a synchronous rectifier field-effect transistor (FET). In those cases, the synchronous rectifier FET may be a surface mount synchronous rectifier FET having a body 126 and at least one lead 128.

As shown in FIG. 4, the body 126 of the electrical component 124 is soldered to the first surface 112 of the bus bar 110, and the lead 128 of the electrical component 124 is soldered to one or more traces (not shown) of the printed circuit board 102.

Figure 5A:
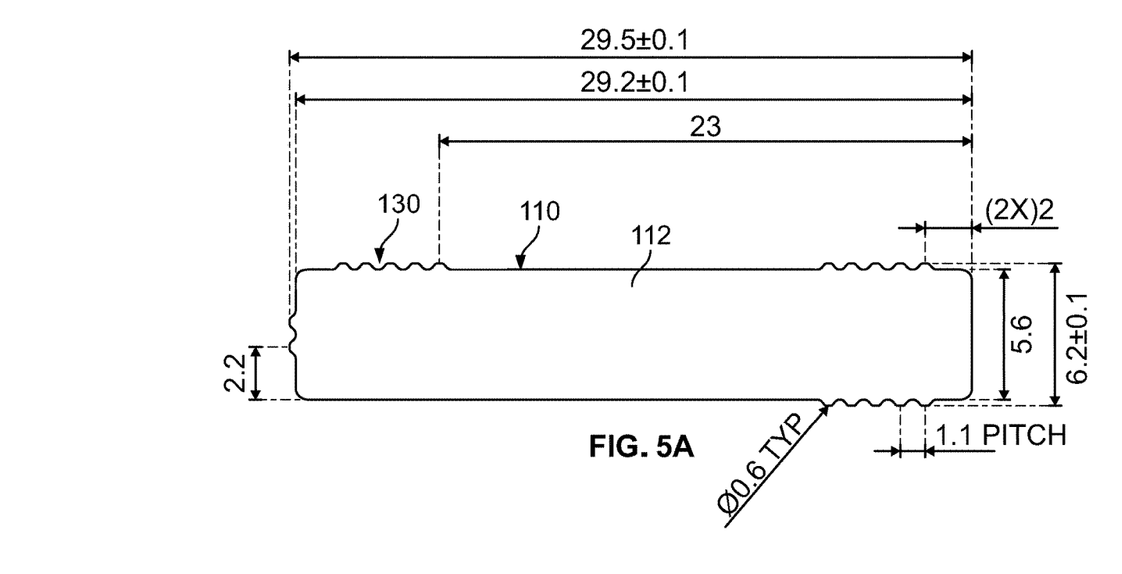
FIG. 5A is a top view of a bus bar of the circuit board assembly of FIG. 1, illustrating example dimensions of the bus bar.
Figure 5B:
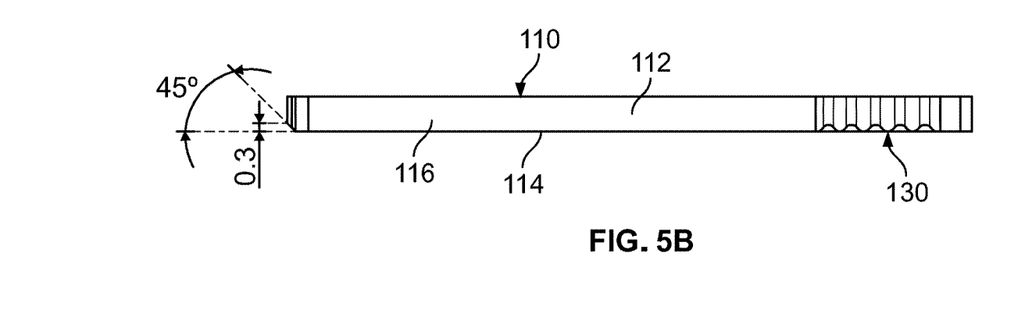
FIG. 5B is a side view of the bus bar of FIG. 5A.
Figure 5C:
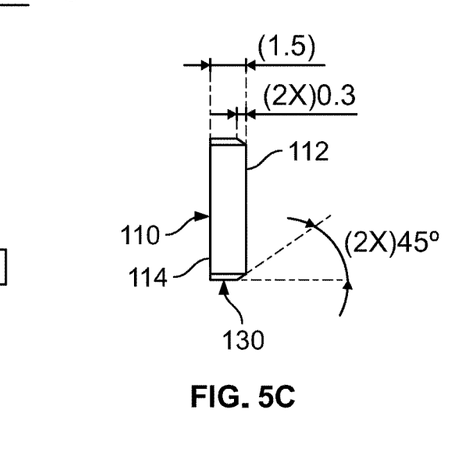
FIG. 5C is an end view of the bus bar of FIG. 5A.

FIGS. 5A, 5B and 5C illustrate example dimensions of the bus bar 110. These example dimensions are for purposes of illustration only, and it should be apparent that other bus bars may include other suitable dimensions without departing from the scope of the present disclosure.

As shown in FIGS. 5A and 5B, the bus bar 110 includes multiple teeth 130 positioned on a portion of the side 116 of the bus bar 110. The multiple teeth 130 mechanically couple the bus bar 110 to the printed circuit board 102 when the bus bar 110 is press-fit into the opening 108 defined by the printed circuit board 102.

The bus bar 110 may include any suitable electrically conductive material. For example, the bus bar 110 can be a copper sheet metal bus bar. In some embodiments, the bus bar 110 may conform to JIS H3100-Grade C1100 1/2H.

Figure 6:
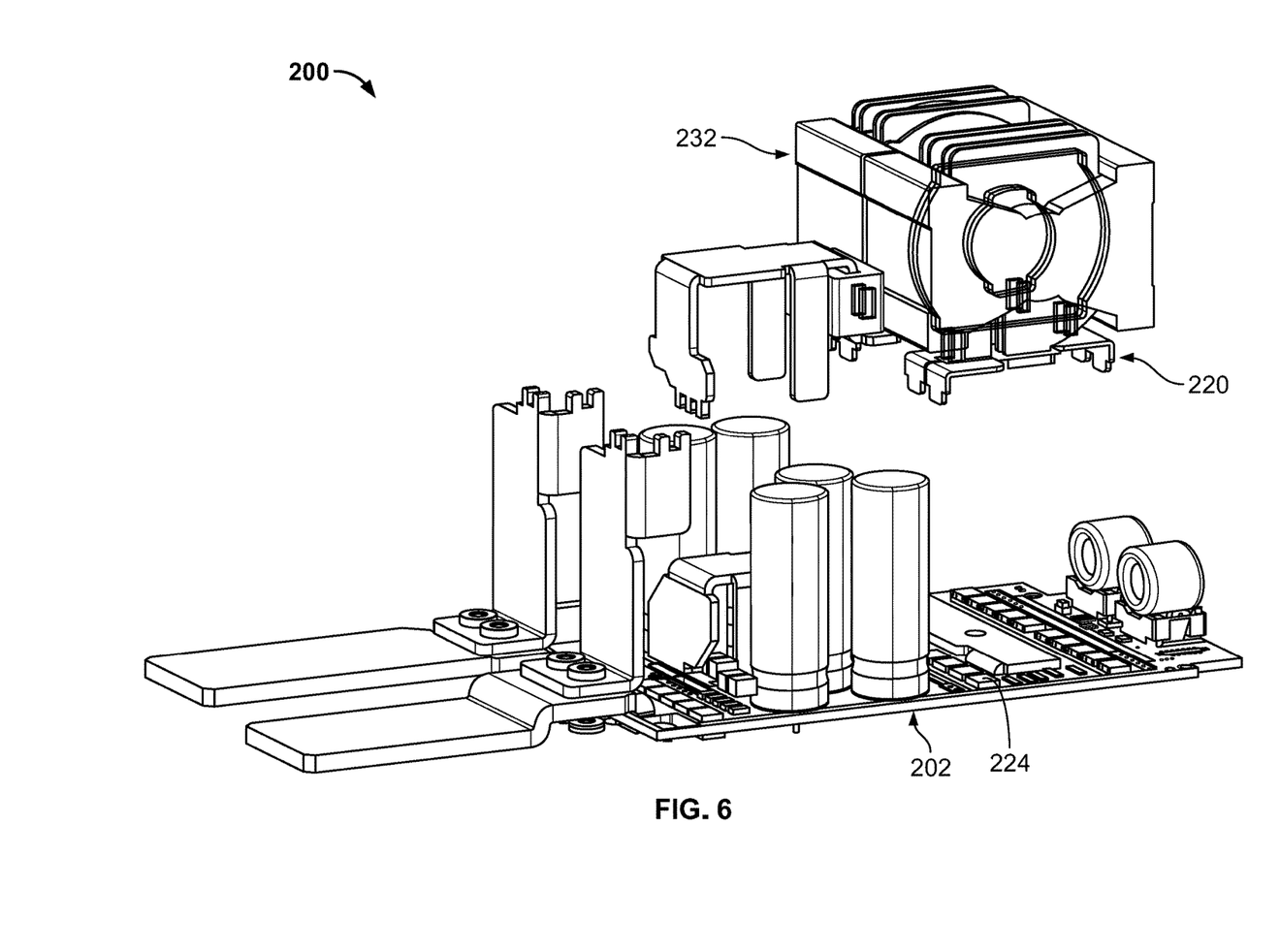
FIG. 6 is an exploded perspective view of a circuit board assembly according to another example embodiment of the present disclosure.
Figure 7:
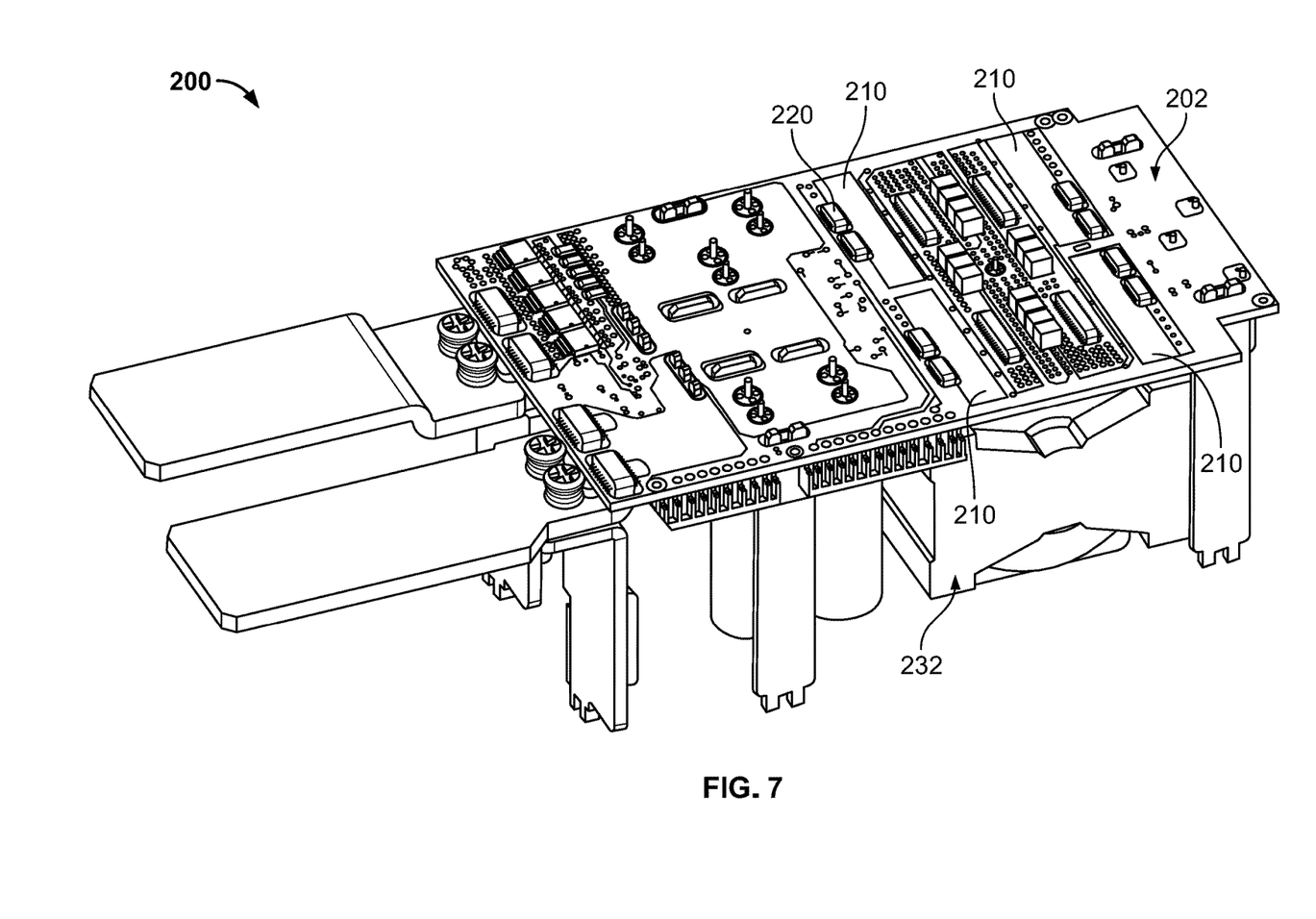
FIG. 7 is a bottom perspective view of the circuit board assembly of FIG. 6.
Figure 8:
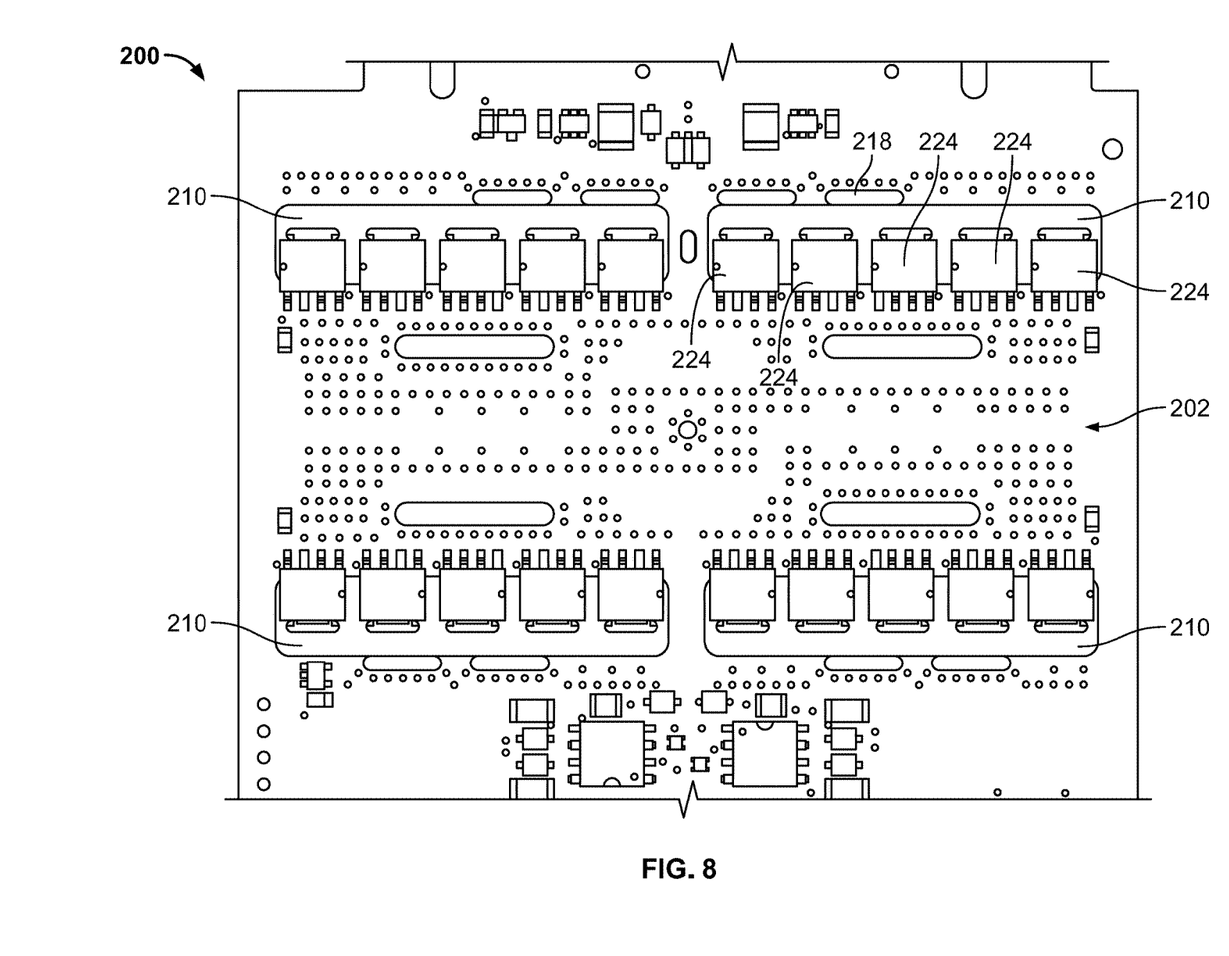
FIG. 8 is a top view of a portion of the circuit board assembly of FIG. 6.

FIGS. 6-8 illustrate a circuit board assembly 200 according to another example embodiment of the present disclosure. As shown in FIG. 6, the circuit board assembly includes a printed circuit board 202, and a transformer 232.

The transformer 232 includes electrical leads 220. The electrical leads 220 are inserted into slots 218 defined between the printed circuit board 202 and press-fit bus bars 210. The electrical leads 220 of the transformer 232 are then wave soldered to the press-fit bus bars 210.

The circuit board assembly 200 also includes multiple electrical components 224. Each electrical component 224 is positioned in thermal contact with one of the bus bars to dissipate heat from the electrical component 224 to the bus bar.

FIG. 8 illustrates a top view of the circuit board assembly 200 prior to inserting the transformer electrical leads 220 into the slots 218. As shown in FIG. 8, multiple electrical components 224 are positioned on each bus bar 210.

According to another aspect of the present disclosure, a method of assembling a printed circuit board and a bus bar is disclosed. The printed circuit board includes a first surface and a second surface opposite the first surface, and defines an opening having at least one side extending from the first surface of the printed circuit board to the second surface of the printed circuit board.

The method includes press-fitting a bus bar into the opening defined by a printed circuit board to secure the bus bar in the opening of the printed circuit board, such that a slot is defined between at least one side of the bus bar and at least one side of the opening defined by the printed circuit board.

The method also includes positioning an electrical lead in the slot defined between the at least one side of the bus bar and the at least one side of the opening defined by the printed circuit board, and soldering the electrical lead to the bus bar to electrically couple the electrical lead to the bus bar.

In some embodiments, the electrical lead extends beyond one of the surfaces of the bus bar. In those cases, soldering the electrical lead to the bus bar includes wave soldering the electrical lead to the bus bar.

The bus bar may include multiple teeth positioned along at least a portion of the at least one side of the bus bar. In those situations, press-fitting the bus bar includes positioning the bus bar such that the multiple teeth mechanically couple the bus bar to the opening defined by the printed circuit board.

In some embodiments, the method includes electrically coupling an electrical component to the bus bar to conduct current between the electrical lead and the electrical component. The method may include positioning an electrical component in thermal contact with a surface of the bus bar to dissipate heat from the electrical component to the bus bar.

When the surface of the bus bar is a first surface, positioning the electrical component can include coupling the electrical component to the first surface of the bus bar, and soldering the electrical lead can include wave soldering the electrical lead to a second surface of the bus bar opposite the first surface of the bus bar. Coupling the electrical component to the first surface of the bus bar may include reflow soldering the electrical component to the first surface of the bus bar.

In some embodiments, the electrical component is a synchronous rectifier field-effect transistor (FET) having a body and at least one lead. In those cases, coupling the synchronous rectifier FET to the surface of the bus bar includes soldering the body of the synchronous rectifier FET to the first surface of the bus bar, and soldering at least one lead of the synchronous rectifier FET to one or more traces of the printed circuit board.

Press-fitting the bus bar can include press-fitting the printed circuit board without any adhesives. In some embodiments, press-fitting the bus bar can include press-fitting the bus bar such that a first surface of the bus bar is substantially coplanar with the first surface of the printed circuit board, and a second surface of the bus bar is substantially coplanar with the second surface of the printed circuit board.

Any of the example embodiments and aspects disclosed herein may be used in any suitable combination with any other example embodiments and aspects disclosed herein without departing from the scope of the present disclosure. For example, circuit board assemblies described herein may be assembled using other methods, methods for assembling printed circuit boards and bus bars may be used with other circuit board assemblies, etc., without departing from the scope of the present disclosure.

In some applications, example embodiments described herein may be used in PCB assemblies requiring interconnection between a thru-hole bus bar and a surface mount bus bar. Example electrical components can include surface mount FETs (e.g., DPAK, DPAK2, Thinpak and SOT669 devices). The example printed circuit board assemblies may include synchronous rectification circuits, bridge assist circuits, power factor correction (PFC) circuits, O-ring printed circuit board assemblies, etc.

Example embodiments and aspects of the present disclosure may provide any one or more (or none) of the following advantages: increased electrical efficiently via direct solder of an electrical lead to a press-fit bus bar, reduced electrical interconnection losses, reduction of space allocated to interconnection of the electrical lead and the bus bar, use of standard factory equipment and processes, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A circuit board assembly comprising:
   a printed circuit board including a first surface and a second surface opposite the first surface, the printed circuit board defining an opening having at least one side extending from the first surface of the printed circuit board to the second surface of the printed circuit board;

a bus bar including a first surface, a second surface opposite the first surface, and at least one side extending from the first surface of the bus bar to the second surface of the bus bar, the bus bar secured in the opening of the printed circuit board via a press-fit, with a slot defined between the at least one side of the bus bar and the at least one side of the opening defined by the printed circuit board;

an electrical lead positioned in the slot defined between the at least one side of the bus bar and the at least one side of the opening defined by the printed circuit board; and solder disposed between the electrical lead and the bus bar to electrically couple the electrical lead and the bus bar.

2. The circuit board assembly of claim 1, wherein the first surface of the bus bar is substantially coplanar with the first surface of the printed surface board, and the second surface of the bus bar is substantially coplanar with the second surface of the printed circuit board.

3. The circuit board assembly of claim 1, wherein the bus bar includes multiple teeth positioned along at least a portion of the at least one side of the bus bar to mechanically couple the bus bar to the printed circuit board.

4. The circuit board assembly of claim 1, wherein the electrical lead extends beyond the first surface of the bus bar, and the electrical lead is coupled to the first surface of the bus bar via wave solder.

5. The circuit board assembly of claim 1, further comprising an electrical component in thermal contact with one of the first and second surfaces of the bus bar to dissipate heat from the electrical component to the bus bar.

6. The circuit board assembly of claim 5, wherein the electrical component comprises a synchronous rectifier field-effect transistor (FET).

7. The circuit board assembly of claim 6, wherein:
the synchronous rectifier FET comprises a surface mount synchronous rectifier FET having a body and at least one lead;
the body of the synchronous rectifier FET is soldered to said one of the first and second surfaces of the bus bar; and
the at least one lead of the synchronous rectifier FET is soldered to one or more traces of the printed circuit board.

8. The circuit board of claim 1, wherein the bus bar is coupled to the printed circuit board without adhesives.

9. The circuit board assembly of claim 1, further comprising an electrical component electrically coupled to at least one conductive trace on the printed circuit board, wherein the bus bar is electrically coupled between the electrical lead and the electrical component to conduct current between the electrical lead and the electrical component.

10. The circuit board assembly of claim 9, wherein:
the electrical lead is soldered to the first surface of the bus bar; and
the electrical component is thermally coupled to the second surface of the bus bar.

11. The circuit board assembly of claim 10, wherein the electrical component is coupled to the second surface of the bus bar via solder.

12. The circuit board assembly of claim 1, wherein the bus bar comprises copper sheet metal.

13. A method of assembling a printed circuit board and a bus bar, the printed circuit board including a first surface and a second surface opposite the first surface, the printed circuit board defining an opening having at least one side extending from the first surface of the printed circuit board to the second surface of the printed circuit board, the method comprising:
press-fitting a bus bar into the opening defined by the printed circuit board to secure the bus bar in the opening of the printed circuit board, with a slot defined between at least one side of the bus bar and at least one side of the opening defined by the printed circuit board;
positioning an electrical lead in the slot defined between the at least one side of the bus bar and the at least one side of the opening defined by the printed circuit board; and
soldering the electrical lead to the bus bar to electrically couple the electrical lead to the bus bar.

14. The method of claim 13, wherein:
the bus bar includes multiple teeth positioned along at least a portion of the at least one side of the bus bar; and
press-fitting the bus bar includes positioning the bus bar with the multiple teeth mechanically coupling the bus bar to the opening defined by the printed circuit board.

15. The method of claim 13, further comprising positioning an electrical component in thermal contact with a surface of the bus bar to dissipate heat from the electrical component to the bus bar.

16. The method of claim 15, wherein:
the surface of the bus bar is a first surface;
positioning the electrical component includes coupling the electrical component to the first surface of the bus bar; and
soldering the electrical lead includes wave soldering the electrical lead to a second surface of the bus bar opposite the first surface of the bus bar.

17. The method of claim 16, wherein coupling the electrical component to the first surface of the bus bar comprises reflow soldering the electrical component to the first surface of the bus bar.

18. The method of claim 16, wherein:
the electrical component comprises a synchronous rectifier field-effect transistor (FET) having a body and at least one lead; and
coupling the synchronous rectifier FET to the surface of the bus bar includes:
soldering the body of the synchronous rectifier FET to the first surface of the bus bar; and
soldering at least one lead of the synchronous rectifier FET to one or more traces of the printed circuit board.

19. The method of claim 13, wherein press-fitting the bus bar includes press-fitting the bus bar without adhesives.

20. The method of claim 13, wherein press-fitting the bus bar includes press-fitting the bus bar with a first surface of the bus bar substantially coplanar with the first surface of the printed circuit board, and a second surface of the bus bar substantially coplanar with the second surface of the printed circuit board.

21. The method of claim 13, wherein the electrical lead extends beyond one of the surfaces of the bus bar, and soldering the electrical lead to the bus bar comprises wave soldering the electrical lead to the bus bar.

22. A circuit board assembly comprising:
a circuit board having opposite first and second sides, the circuit board defining an opening extending from the first side to the second side;
a bus bar coupled to the first side of the circuit board via a press-fit; and
an electrical component coupled to the second side of the circuit board, the electrical component having a lead, the lead extending through said opening from the second side of the circuit board to the first side of the circuit board and soldered to the bus bar on the first side of the circuit board.

23. The assembly of claim 22, wherein the electrical component comprises a transformer.

24. The assembly of claim 22, further comprising a field-effect transistor (FET) having a body and one or more leads, wherein the first side of the circuit board includes one or more conductive traces, the body of the FET is soldered to the bus bar, and the one or more leads are soldered to the one or more conductive traces.

25. The assembly of claim 22, wherein the bus bar is coupled to the first side of the circuit board via the press-fit without chemical adhesives.

* * * * *